(12) United States Patent
Sharf et al.

(10) Patent No.: US 8,592,692 B2
(45) Date of Patent: Nov. 26, 2013

(54) SUBSTRATE HAVING A PLURAL DIAMETER VIA

(75) Inventors: Alex Michael Sharf, Harrisburg, PA (US); Jie Qin, Hummelstown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 130 days.

(21) Appl. No.: 13/189,278

(22) Filed: Jul. 22, 2011

(65) Prior Publication Data

US 2013/0020121 A1  Jan. 24, 2013

(51) Int. Cl.
*H05K 1/11*  (2006.01)
(52) U.S. Cl.
USPC ............ 174/266; 174/262; 257/698; 361/792
(58) Field of Classification Search
USPC ............ 174/262–266; 361/792–795; 257/698
See application file for complete search history.

(56) References Cited

U.S. PATENT DOCUMENTS

| 4,543,715 | A | 10/1985 | Iadarola et al. | |
|---|---|---|---|---|
| 6,891,272 | B1 | 5/2005 | Fjelstad et al. | |
| 2008/0217052 | A1* | 9/2008 | Matsui | 174/266 |
| 2009/0049414 | A1* | 2/2009 | Mutnury et al. | 716/2 |
| 2009/0121360 | A1* | 5/2009 | Takewaki | 257/773 |
| 2010/0109164 | A1* | 5/2010 | Kang et al. | 257/774 |

* cited by examiner

*Primary Examiner* — Hoa C Nguyen
*Assistant Examiner* — Amol Patel

(57) ABSTRACT

A substrate is provided that includes a plurality of substrate layers and a plural diameter via having a first via portion and a second via portion. The first via portion is formed in a first substrate layer, has a first diameter, and extends along a first axis. The second via portion is formed in a second substrate layer, has a second diameter that is different than the first diameter of the first via portion, and extends along a second axis that is offset from the first axis of the first via portion. Optionally, the first via portion and the second via portion may have a common edge that is spaced the same distance from an edge of another via extending through the substrate.

20 Claims, 4 Drawing Sheets

SUBSTRATE HAVING A PLURAL DIAMETER VIA

BACKGROUND OF THE INVENTION

The subject matter described herein relates generally to substrates having a plural diameter via.

Substrates generally include vias formed therein. The vias are plated with a conductive material that is configured to electrically couple to a contact of an electrical component. The vias electrically couple the electrical component to signal traces extending through the substrate so that the electrical component can direct signals and/or power through the substrate. Often, the vias are formed as dual-diameter vias. The dual-diameter via includes a first portion having a first diameter and a second portion having a second diameter that is greater than the diameter of the first portion. The dual-diameter vias are typically formed by drilling the via using one size drill and then redrilling using a larger size drill. The first portion and the second portion are concentrically aligned. The dual-diameter via improves manufacturing by providing a larger diameter that is easier to plate with conductive materials while maintaining at least some of the electrical properties of a smaller diameter via.

However, conventional dual-diameter vias are not without their disadvantages. In particular, the dual-diameter via may be positioned in proximity to another via. Because the first portion and the second portion of the dual-diameter via are concentric, the first portion and the second portion may be spaced at different distances from the adjacent via. The spacing between the dual-diameter via and the adjacent via may affect the electrical properties of either via. In particular, because the first and second portions of the dual-diameter via are spaced at different distances from the adjacent via, an impedance of each via may be affected so that a target impedance is not met. Additionally, the non-uniform spacing between the vias may increase return loss, noise, and crosstalk between the two vias.

A need remains for a substrate having a plural-diameter via that improves electrical performance.

SUMMARY OF THE INVENTION

In one embodiment, a substrate is provided that includes a plurality of substrate layers and a plural diameter via having a first via portion and a second via portion. The first via portion is formed in a first substrate layer, has a first diameter, and extends along a first axis. The second via portion is formed in a second substrate layer, has a second diameter that is different than the first diameter of the first via portion, and extends along a second axis that is offset from the first axis of the first via portion.

Optionally, the first via portion and the second via portion may have a common edge that is spaced the same distance from an edge of another via extending through the substrate. A tangential plane may intersect the first via portion at a first edge of the first via portion and the second via portion at a second edge of the second via portion where the first edge is aligned with the second edge. The first edge and the second edge may be positioned equidistant from an edge of another via extending through the substrate. Optionally, the first via portion may have a first radius and the second via portion may have a second radius where the second axis is offset by a distance substantially equal to the second radius less the first radius.

In another embodiment, a substrate is provided having a plurality of substrate layers and a stepped via having a first via portion and a second via portion with a step therebetween. The first via portion is formed in a first substrate layer and has a first radius. The second via portion is formed in a second substrate layer and has a second radius that is different than the first radius. The second via portion is offset with respect to the first via portion by a distance substantially equal to the second radius less the first radius.

In a further embodiment, a substrate is provided having a plurality of substrate layers. A first via extends through the plurality of substrate layers and has a smaller diameter portion and a larger diameter portion. The smaller diameter portion is formed in a first substrate layer, extends along a first axis, and has a first edge. The larger diameter portion is formed in a second substrate layer, extends along a second axis that is offset from the first axis, and has a second edge aligned with the first edge. A second via extends through the plurality of substrate layers. The second via has a second via edge that is equidistant from the first edge of the smaller diameter portion and from the second edge of the larger diameter portion.

DETAILED DESCRIPTION OF THE INVENTION

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
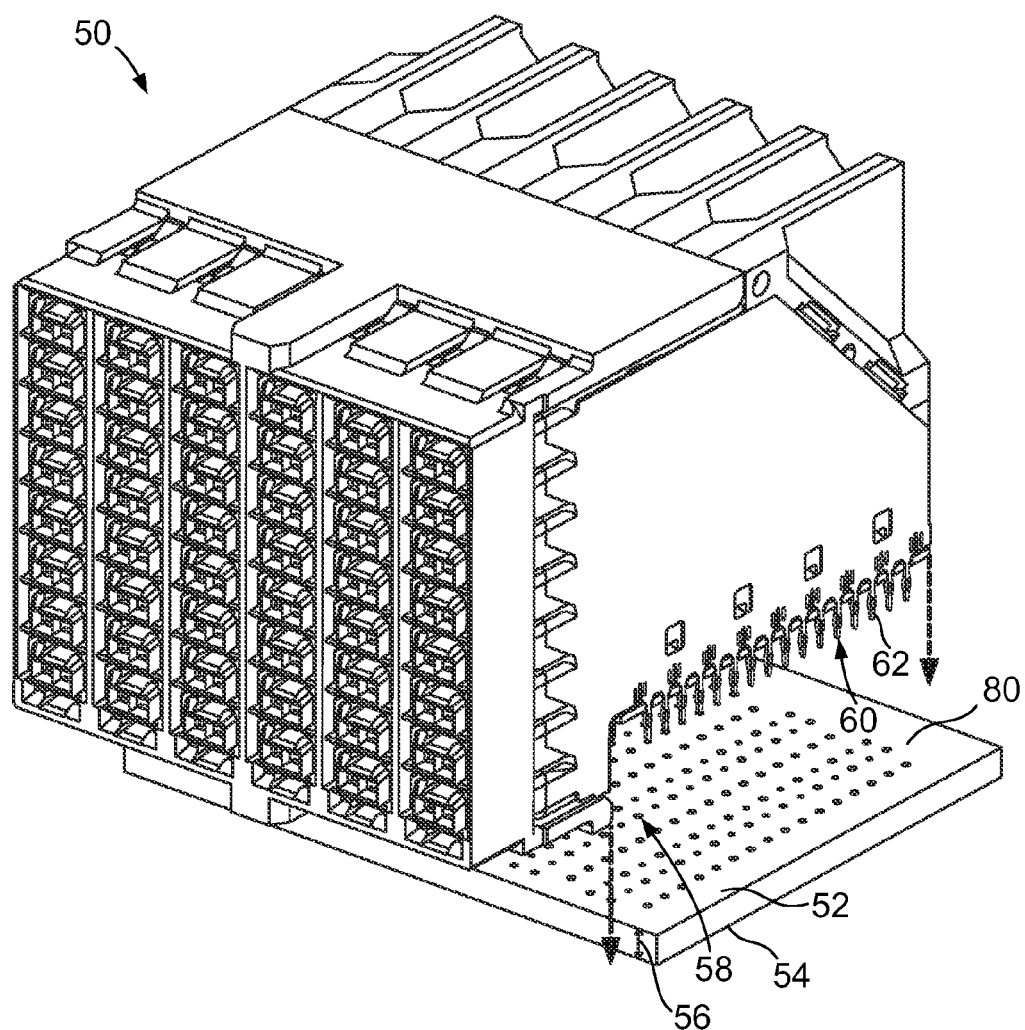
FIG. 1 is a perspective view of an electrical connector poised for mounting to a substrate formed in accordance with an exemplary embodiment.

FIG. 1 is a top perspective view of an electrical connector 50 poised for mounting to a substrate 80 formed in accordance with an exemplary embodiment. In the illustrated embodiment, the substrate 80 is a circuit board. The substrate 80 includes an upper surface 52 and a lower surface 54 opposite the upper surface 52 with a thickness or height 56 of the substrate 80 defined therebetween. The electrical connector 50 is configured to be mounted to the upper surface 52. The substrate 80 includes a plurality of vias 58 extending therethrough. The vias 58 may be signal vias, ground vias and/or power vias. The vias 58 are plated, but may be entirely filled in alternative embodiments.

The electrical connector 50 includes an interface 60 that is configured to be mounted to the substrate 80. In the illustrated embodiment, the electrical connector 50 includes a plurality of contacts 62 (e.g. compliant pins or eye-of-the-needle pins) that are configured to be received in corresponding vias 58. In alternative embodiments, the contacts 62 may be surface mounted to pads on the mounting surface 52 that are electrically connected to the vias 58. For example, the substrate 80 may be part of an interposer configured to be used to electrically interconnect two electrical components on opposite sides of the substrate 80, such as two circuit boards or a circuit board and a chip or processor.

Figure 2:
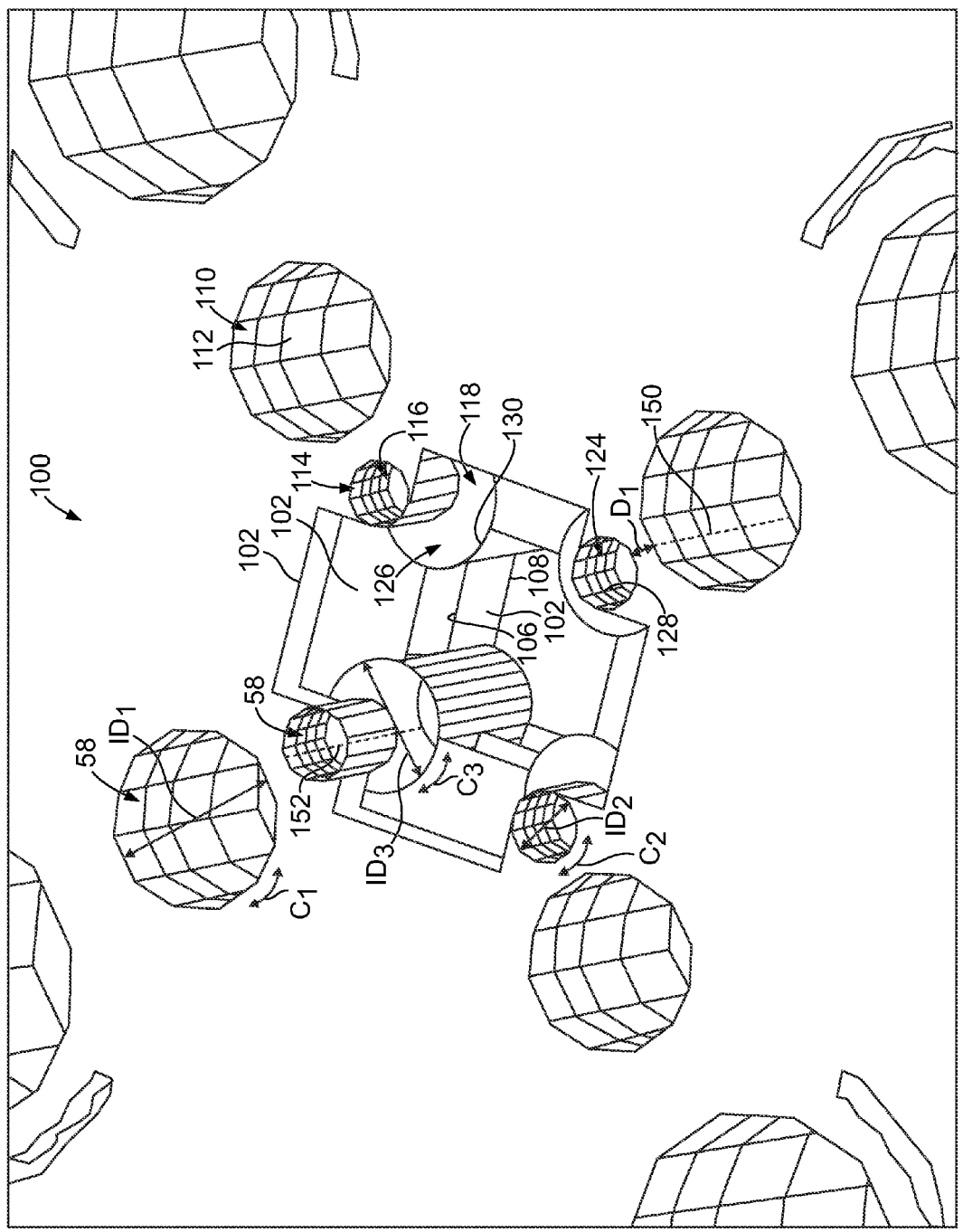
FIG. 2 is a top perspective view of a portion of the substrate shown in FIG. 1.

FIG. 2 is a top perspective view of a portion of a substrate 100 with a portion of the substrate 100 cutaway showing the layers therein. The substrate 100 may be similar to the substrate 80 (shown in FIG. 1) and may include lie features identified with like reference numerals. The substrate 100 may be configured to be electrically connected to the electrical connector 50 or a similar electrical component. The substrate 100 may differ from the substrate 80 in that the substrate 100 may have a different pattern of vias. The substrate 100 includes a plurality of substrate layers 102. The substrate layers 102 are arranged in parallel planes. The substrate layers 102 are stacked on top of one another. Any number of substrate layers 102 may be provided.

Each substrate layer 102 includes an upper surface 106 and a lower surface 108. References to a first substrate layer and a second substrate layer may refer to any of the substrate layers and is not limited to substrate layers that are adjacent one another or that are the outermost substrate layers. The substrate layers 102 may include signal traces (not shown) or ground layers extending therethrough. The signal traces may be embedded within the substrate layers 102 and/or extend along one of the upper surface 106 and/or the lower surface 108. The signal traces carry electrical signals through the substrate 100. The signal traces carry electrical signals between electrical components that are electrically coupled to the substrate 100.

The vias 58 extend through the substrate 100. In an exemplary embodiment, the substrate 100 may include different types of vias 58. The substrate 100 may include single-diameter vias 110, which are cylindrical in shape. The substrate 100 includes stepped vias or plural diameter vias 114, which are non-cylindrical in shape. The plural diameter vias 114 may have any number of segments or portions that have different diameters, but the embodiments shown herein relate to dual-diameter vias. The plural diameter vias 114 are not intended to be limited to dual-diameter vias. The substrate 100 may include signal vias, ground vias and/or power vias. The signal vias, ground vias and/or power vias may be either single-diameter vias 110 or plural diameter vias 114. The configurations (e.g. size, spacing, positioning, and the like) of the vias 58 may depend on the particular application and the configurations illustrated in the Figures are merely exemplary.

The single-diameter vias 110 may be signal vias, ground vias or power vias. The vias 110 have an inner diameter $ID_1$ and a circumference $C_1$ that remain substantially constant through the height 56 (shown in FIG. 1) of the substrate 100. The vias 110 may have any suitable inner diameter $ID_1$ and circumference $C_1$. The vias 110 may extend through any number of substrate layers 102. The via 110 has a depth $d_1$ (shown in FIG. 4) equal to the height 56 of the substrate 100. The via 110 has an aspect ratio defined by $d_1/ID_1$.

The vias 110 include an inner surface 112. In an exemplary embodiment, the inner surface 112 is plated with a conductive material, such as copper. The vias 110 are configured to receive the contacts 62 (shown in FIG. 1) of the electrical connector 50 (shown in FIG. 1). The contacts 62 engage the conductive material to form an electrical connection between the contacts 62 and the via 110. The conductive material is electrically coupled to signal traces extending through the substrate 100. The vias 110 electrically couple the electrical connector 50 to the signal traces.

The substrate 100 also includes a plurality of the plural diameter vias 114. In the illustrated embodiment, the vias 114 are ground vias, however the vias 114 may be other types of vias in alternative embodiments. The vias 114 are positioned proximate to corresponding vias 110. In the illustrated embodiment, a plurality of the vias 114 is grouped together between adjacent signal vias, represented by the single-diameter vias 110. The vias 114 are electrically connected to ground planes in the substrate 100. Alternatively, the vias 114 may be signal vias connected to corresponding signal traces.

The plural diameter vias 114 include more than one different diameter portions or segments. In the illustrated embodiment, each via 114 includes a first portion 116 and a second portion 118. The first portion 116 is a smaller diameter portion, and may be referred to hereinafter as smaller diameter portion 116. The second portion 118 is a larger diameter portion, and may be referred to hereinafter as larger diameter portion 118. The first portion 116 extends through at least one of the substrate layers 102. The second portion 118 also extends through at least one of the substrate layers 102. In an exemplary embodiment, the first portion 116 extends through substrate layers 102 that are adjacent to the substrate layers 102 through which the second portion 118 extend. The first portion 116 is positioned on top of the second portion 118, however the orientation may be reversed with the first portion 116 below the second portion 118 in alternative embodiments.

The smaller diameter portion 116 includes a central axis 120 (shown in FIG. 4) extending therethrough. The larger diameter portion 118 includes a central axis 122 (shown in FIG. 4) extending therethrough. The portions 116, 118 are non-centric such that the axis 122 is offset with respect to the axis 120.

The smaller diameter portion 116 has an inner diameter $ID_2$ and a circumference $C_2$. The larger diameter portion 118 has an inner diameter $ID_3$ and a circumference $C_3$. The inner diameter $ID_3$ of the larger diameter portion 118 is wider than the inner diameter $ID_2$ of the smaller diameter portion 116. The circumference $C_3$ of the larger diameter portion 118 is greater than the circumference $C_2$ of the smaller diameter portion 116.

Figure 4:
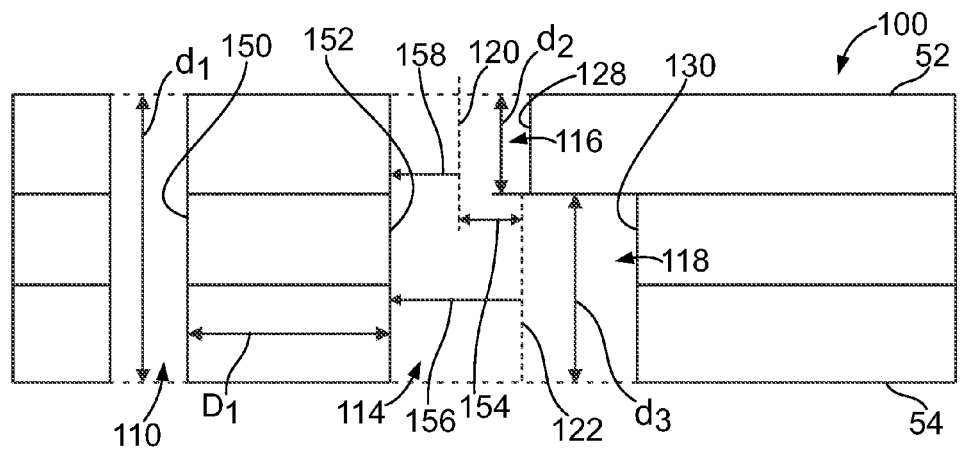
FIG. 4 is a side cut-away view of a portion of the substrate shown in FIG. 2.

The smaller diameter portion 116 has a depth $d_2$ (shown in FIG. 4) and the larger diameter portion 118 has a depth $d_3$ (shown in FIG. 4). In the illustrated embodiment, the depth $d_3$ of the larger diameter portion 118 is greater than the depth $d_2$ of the smaller diameter portion 116. Alternatively, the depth $d_3$ of the larger diameter portion 118 may be less than or equal to the depth $d_2$ of the smaller diameter portion 116. The smaller diameter portion 116 has an aspect ratio defined by $d_2/ID_2$. The larger diameter portion 118 has an aspect ratio defined by $d_3/ID_3$. The smaller diameter portion 116 and the larger diameter portion 118 may have any suitable aspect ratios.

The smaller diameter portion 116 of the via 114 has an opening 124 extending therethrough defined by an inner surface 128 of the smaller diameter portion 116. The inner surface 128 is plated with a conductive material, for example, copper. The smaller diameter portion 116 is configured to receive one of the contacts 62 of the electrical connector 50. The contact 62 engages the conductive material to electrically couple the contact 62 to the via 114. The conductive material may be electrically coupled to one or more ground planes of the substrate 100.

The larger diameter portion 118 of the via 114 has an opening 126 extending therethrough defined by an inner surface 130 of the larger diameter portion 118. The opening 126 is aligned with at least a portion of the opening 124. The inner surface 130 is plated with a conductive material, for example, copper. Optionally, the larger diameter portion 118 may be configured to receive a portion of one of the contacts 62. The contact 62 may engage a portion of the conductive material. The conductive material in the larger diameter portion 118 is electrically coupled to one or more ground planes of the substrate 100.

The electrical performance of the substrate 100 is impacted by the configuration of the vias 110 with respect to the vias 114. For example, the spacing between the vias 110, 114 may affect the electrical performance of the signals transmitted through the vias 110. The vias 110 have edges 150 that are nearest the vias 114. The vias 114 have edges 152 that are nearest the vias 110. The edges 150, 152 are spaced apart by an edge distance $D_1$. The smaller diameter portion 116 is positioned the same edge distance $D_1$ from the via 110 as the larger diameter portion 118 from the via 110. By positioning the smaller diameter portion 116 and the larger diameter portion 118 the same edge distance $D_1$ from the via 110, the signal speed through the substrate 100 may be improved. For example, the impedance, return loss, cross-talk, noise and the like may be affected by the spacing between the signal and ground vias 110, 114. Having the spacing uniform through the substrate 100 may provide better electrical characteristics as compared to a substrate in which the edge 152 of the smaller diameter portion 116 is positioned further from the via 110 than the edge 152 of the larger diameter portion 118, as is the case with concentric dual-diameter vias. With concentric dual diameter vias, the conductive material of the smaller diameter portion is positioned further from the adjacent via than the conductive material of the larger diameter portion, which leads to impedance mis-match. Having the edges 152 of the smaller diameter portion 116 and the larger diameter portion 118 aligned, overcomes the impedance mis-match problem associated with concentric dual-diameter vias.

Figure 3:
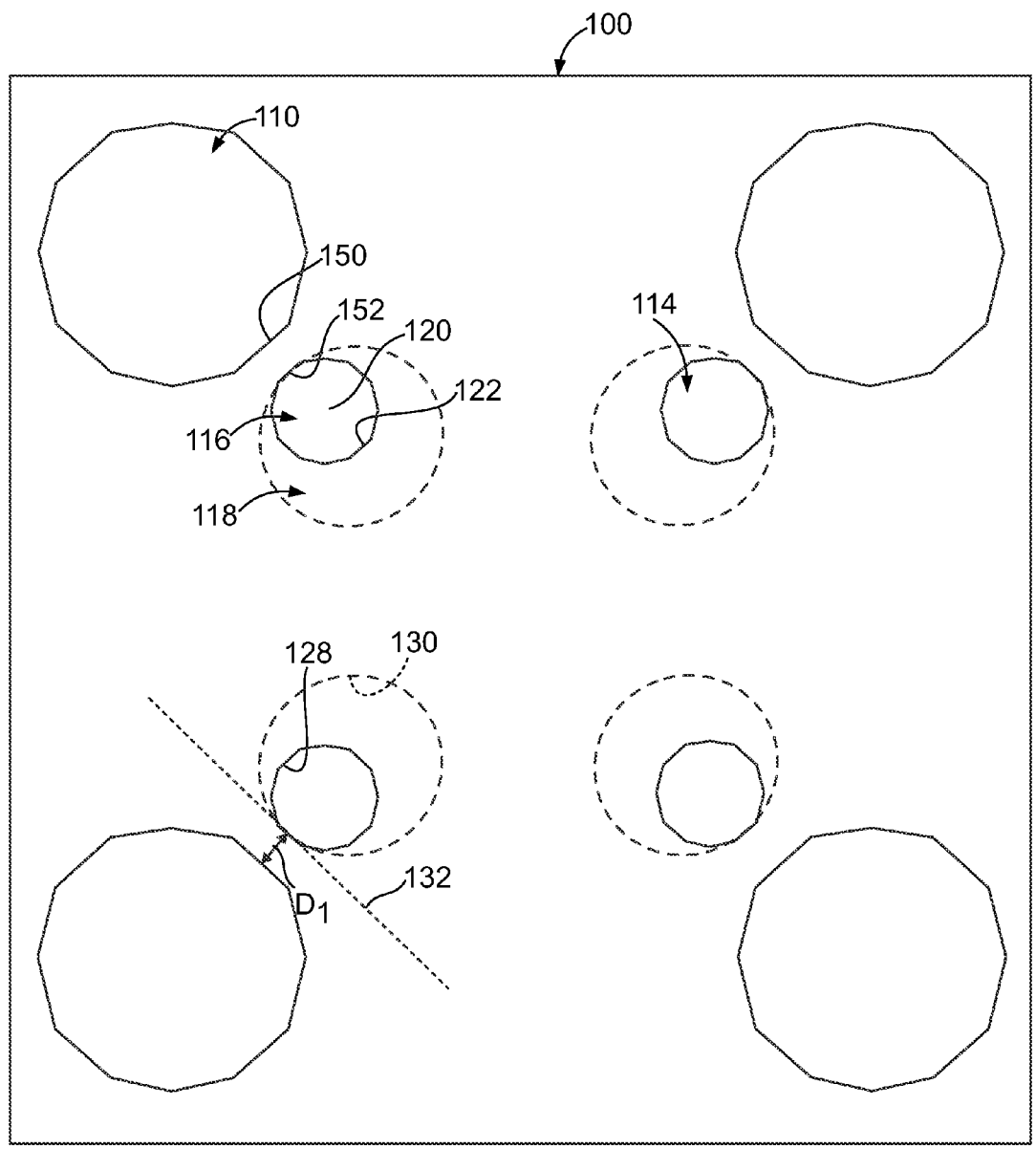
FIG. 3 is a top view of a portion of the substrate shown in FIG. 2.

FIG. 3 is a top view of a portion of the substrate 100. The first portion 116 of the via 114 is non-centric with respect to the second portion 118. The first axis 120 is shifted toward the nearest via 110 with respect to the second axis 122, which is shifted away from the nearest via 110. The first and second portions 116, 118 are offset by a predetermined amount such that a single edge 152 of each portion 116, 118 is aligned at the nearest point of the via 114 to the via 110.

A tangential plane 132 is defined at the edge 152. The tangential plane 132 is tangential to both the first portion 116 and the second portion 118. The tangential plane 132 is tangent to the inner surface 128 of the first portion 116. The tangential plane 132 is also tangent to the inner surface 130 of the second portion 118. The first portion 116 and the second portion 118 abut the tangential plane 132 at the edge 152. The edge distance $D_1$ from the first portion 116 to the via 110 is the same as the edge distance $D_1$ from the second portion 118 to the via 110.

FIG. 4 is a side cut-away view of a portion of the substrate 100. The substrate 100 includes the single-diameter via 110 and the plural diameter via 114. FIG. 4 shows the smaller diameter portion 116 and the larger diameter portion 118 being non-centric with the first and second axes 120, 122 offset. The edge 150 of the via 110 faces the edge 152 of the via 114. The inner surfaces 128, 130 of the smaller diameter portion 116 and the larger diameter portion 118, respectively, are aligned at the edge 152. The edge 152 is a uniform edge distance $D_1$ from the edge 150.

In one embodiment, the via 114 is formed in a two step process. First, the smaller diameter portion 116 is formed through the entire substrate 100 from the upper surface 52 along the central axis 120, such as by drilling into the substrate 100. Next, the larger diameter portion 118 is formed through a portion of the substrate 100 from the lower surface 54 along the central axis 122, which is offset from the axis 120. In an alternative embodiment, the via 114 is formed by drilling the smaller diameter portion 116 only partially through the substrate 100 and then drilling the larger diameter portion 118. In an exemplary embodiment, the central axis 122 is offset from the central axis 120 by an offset distance 154. In an exemplary embodiment, the offset distance 154 is substantially equal to a radius 156 of the larger diameter portion 118 less a radius 158 of the smaller diameter portion 116. Shifting by the offset distance 154 aligns the inner surfaces 128, 130 of the smaller diameter portion 116 and the larger diameter portion 118, respectively, at the edge 152.

Figure 5:
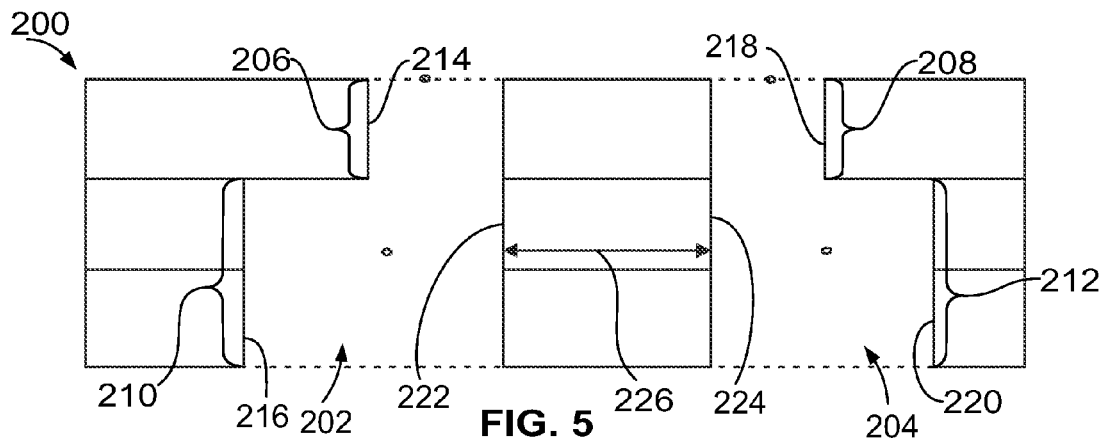
FIG. 5 is a side cut-away view of a substrate formed in accordance with another embodiment.

FIG. 5 is a side cut-away view of a substrate 200 formed in accordance with another embodiment. The substrate 200 is similar to the substrate 100, however the substrate 200 includes a first plural diameter via 202 and a second plural diameter via 204. Both vias 202, 204 are non-centric vias. Both vias 202, 204 include smaller diameter portions 206, 208, respectively and larger diameter portions 210, 212, respectively.

The smaller diameter portion 206 of the via 202 includes an inner surface 214. The larger diameter portion 210 of the via 202 includes an inner surface 216. The smaller diameter portion 208 of the via 204 includes an inner surface 218. The larger diameter portion 212 of the via 204 includes an inner surface 220. The larger diameter portions 210, 212 are shifted away from one another such that inner surfaces 216, 220 of the larger diameter portions 210, 212 are aligned with the inner surfaces 214, 218 of the smaller diameter portions 206, 208 along corresponding edges 222, 224. The edges 222, 224 are spaced apart by a uniform edge distance 226. Providing a constant edge distance 226 between the vias 202, 204 improves the performance of signals transmitted through either or both vias 202, 204.

Figure 6:
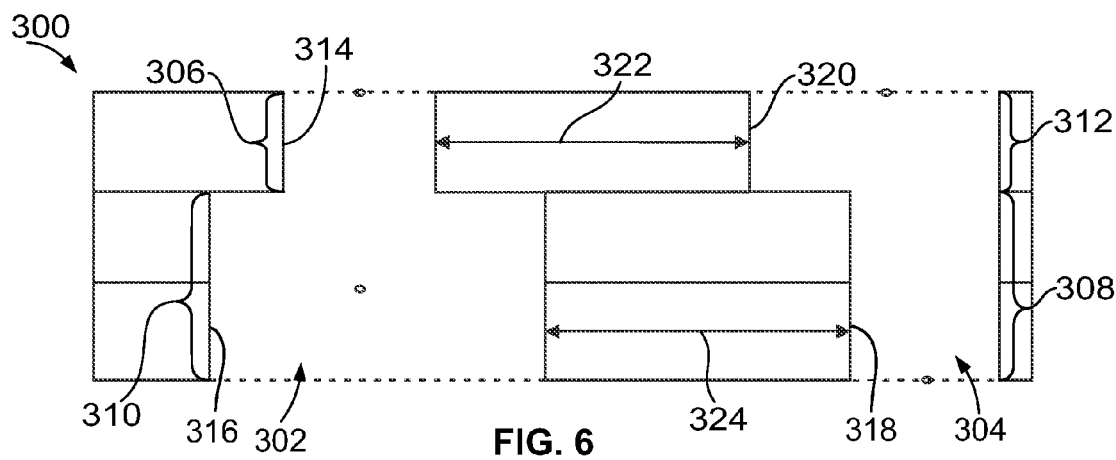
FIG. 6 is a side cut-away view of a substrate formed in accordance with another embodiment.

FIG. 6 is a side cut-away view of a substrate 300 formed in accordance with another embodiment. The substrate 300 includes a first plural diameter via 302 and a second plural diameter via 304. The substrate 300 is similar to the substrate 200 (shown in FIG. 5), however the via 302 is a concentric via while the via 304 is a non-centric via. Both vias 302, 304 include smaller diameter portions 306, 308, respectively and larger diameter portions 310, 312, respectively. In the illustrated embodiment, the via 302 has the smaller diameter portion 306 above the larger diameter portion 310. The via 304 has the larger diameter portion 312 above the smaller diameter portion 308.

The smaller diameter portion 306 of the via 302 includes an inner surface 314. The larger diameter portion 310 of the via 302 includes an inner surface 316. The smaller diameter portion 308 of the via 304 includes an inner surface 318. The larger diameter portion 312 of the via 304 includes an inner surface 320.

In the illustrated embodiment, the larger diameter portion 312 is substantially aligned with the smaller diameter portion 306 in the same layer(s) of the substrate 300. The larger diameter portion 312 may extend different depths then the smaller diameter portion 306. The larger diameter portion 312 is shifted toward the smaller diameter portion 306. The inner surface 320 is spaced from the inner surface 314 by an edge distance 322.

In the illustrated embodiment, the larger diameter portion 310 is aligned with the smaller diameter portion 308 in the same layer(s) of the substrate 300. The larger diameter portion 310 may extend different depths then the smaller diameter portion 308. The larger diameter portion 310 is shifted toward the smaller diameter portion 308. The inner surface 318 is spaced from the inner surface 316 by an edge distance 324. The edge distance 324 is substantially equal to the edge distance 322. Providing substantially equal edge distances 322, 324 between the portions of the vias 302, 304 improves the performance of signals transmitted through either or both vias 302, 304.

In the illustrated embodiment, the outer edge of the via 304 furthest from the via 302 is substantially aligned along the via 304. The outer edge of the via 302 furthest from the via 304 is stepped with the larger diameter portion 310 stepped further away from the via 304. In an alternative embodiment, the outer edge of the via 302 furthest from the via 304 may be substantially aligned along the via 302.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A substrate comprising:
   a plurality of substrate layers; and
   a plural diameter via extending entirely through the substrate, the plural diameter via having a first via portion and a second via portion;
   the first via portion formed in a first substrate layer, the first via portion having a first diameter, the first via portion extending along a first axis;
   the second via portion formed in a second substrate layer, the second via portion having a second diameter that is different than the first diameter of the first via portion, the second via portion extending along a second axis that is offset from the first axis of the first via portion;
   wherein the first via portion and the second via portion have a common edge that is spaced the same distance from an edge of another via extending through the substrate.

2. The substrate of claim 1, wherein the common edge extends vertically entirely through the substrate.

3. The substrate of claim 1, wherein a tangential plane intersects the first via portion at a first edge of the first via portion and the tangential plane intersects the second via portion at a second edge of the second via portion, the first edge being aligned with the second edge.

4. The substrate of claim 1, wherein a tangential plane intersects the first via portion at a first edge of the first via portion and the tangential plane intersects the second via portion at a second edge of the second via portion, the first edge and the second edge being positioned equidistant from an edge of another via extending through the substrate.

5. The substrate of claim 1, wherein the first via portion has a first radius and the second via portion has a second radius, the second axis being offset by a distance substantially equal to the second radius less the first radius.

6. The substrate of claim 1, wherein at least one of the first via portion or the second via portion extends through multiple substrate layers.

7. The substrate of claim 1, wherein the first via portion is formed through one or more substrate layers from a top of the substrate along the first axis and the second via portion is formed through one or more substrate layers from a bottom of the substrate along the second axis.

8. The substrate of claim 1, wherein the plural diameter via defines a ground via, the first via portion being plated and being electrically connected to at least one ground layer of the substrate, the second via portion being plated and being electrically connected to at least one ground layer of the substrate.

9. The substrate of claim 1, wherein the substrate includes an upper surface and a lower surface, the plural diameter via extending entirely through the substrate between the upper and lower surfaces, the first and second via portions having inner surfaces being plated with a conductive material.

10. A substrate comprising:
    a plurality of substrate layers; and
    a stepped via having a first via portion and a second via portion, with a step therebetween, the first via portion formed in a first substrate layer, the first via portion having a first radius, the second via portion formed in a second substrate layer, the second via portion having a second radius that is different than the first radius;
    wherein the second via portion is offset with respect to the first via portion by a distance substantially equal to the second radius less the first radius; and
    wherein the first via portion and the second via portion have a common edge that is spaced the same distance from an edge of another via extending through the substrate.

11. The substrate of claim 10, wherein the first via portion extends along a first axis, the second via portion extends along a second axis, the second axis being offset from the first axis.

12. The substrate of claim 10, wherein a tangential plane intersects the first via portion at a first edge of the first via portion and the tangential plane intersects the second via portion at a second edge of the second via portion, the first edge being aligned with the second edge.

13. The substrate of claim 10, wherein a tangential plane intersects the first via portion at a first edge of the first via portion and the tangential plane intersects the second via portion at a second edge of the second via portion, the first edge and the second edge being positioned equidistant from an edge of another via extending through the substrate.

14. The substrate of claim 10, wherein the first via portion is formed through one or more substrate layers from a top of the substrate along the first axis and the second via portion is formed through one or more substrate layers from a bottom of the substrate along the second axis.

15. A substrate comprising:
a plurality of substrate layers;
a first via extending through the plurality of substrate layers, the first via having a smaller diameter portion and a larger diameter portion, the smaller diameter portion formed in a first substrate layer, the smaller diameter portion extending along a first axis, the smaller diameter portion having a first edge, the larger diameter portion formed in a second substrate layer, the larger diameter portion extending along a second axis that is offset from the first axis, the larger diameter portion having a second edge aligned with the first edge, the first via defining a ground via electrically connected to at least one ground layer; and
a second via extending through the plurality of substrate layers, the second via having a second via edge that is equidistant from the first edge of the smaller diameter portion and from the second edge of the larger diameter portion, the second via defining a signal via electrically connected to at least one signal trace.

16. The substrate of claim 15, wherein the second via includes a smaller diameter portion and a larger diameter portion, the smaller diameter portion of the second via formed in the first substrate layer, the smaller diameter portion of the second via extending along a third axis, the smaller diameter portion of the second via having a third edge, the larger diameter portion of the second via formed in the second substrate layer, the larger diameter portion of the second via extending along a fourth axis that is offset from the third axis, the larger diameter portion of the second via having a fourth edge aligned with the third edge, the third edge being spaced apart from the first edge by a distance, the second edge being spaced apart from the fourth edge by the distance.

17. The substrate of claim 15, wherein the smaller diameter portion has a first radius and the larger diameter portion has a second radius, the second axis being offset by a distance substantially equal to the second radius less the first radius.

18. The substrate of claim 15, wherein at least one of the smaller diameter portion or the larger diameter portion extends through multiple substrate layers.

19. The substrate of claim 15, wherein the smaller diameter portion is formed through one or more substrate layers from a top of the substrate along the first axis and the larger diameter portion is formed through one or more substrate layers from a bottom of the substrate along the second axis.

20. The substrate of claim 15, wherein the substrate includes an upper surface and a lower surface, the first via extending entirely through the substrate between the upper and lower surfaces, the first and second via portions having inner surfaces being plated with a conductive material.

* * * * *